United States Patent [19]

Gries

[11] 3,950,673
[45] Apr. 13, 1976

[54] GATING CIRCUIT FOR TELEVISION SCR DEFLECTION SYSTEM

[75] Inventor: Robert Joseph Gries, Indianapolis, Ind.

[73] Assignee: RCA Corporation, New York, N.Y.

[22] Filed: Sept. 16, 1974

[21] Appl. No.: 506,636

[30] Foreign Application Priority Data
June 5, 1974 United Kingdom............... 24899/74

[52] U.S. Cl. ............................................. 315/408
[51] Int. Cl.² ........................................ H01J 29/70
[58] Field of Search ........... 315/408, 409, 411, 403, 315/406, 407

[56] References Cited
UNITED STATES PATENTS
3,742,242   6/1973   Morio et al. ......................... 315/409
3,767,960   10/1973  Ahrens................................ 315/408

*Primary Examiner*—Malcolm F. Hubler
*Assistant Examiner*—Richard E. Berger
*Attorney, Agent, or Firm*—E. M. Whitacre; Paul J. Rasmussen

[57] ABSTRACT

In a television deflection system employing a first SCR for coupling a deflection winding across a source of energy during a trace interval of each deflection cycle and a second SCR for replenishing energy to the source of energy during a commutation interval of each deflection cycle, a gating circuit for triggering the first SCR. The gating circuit employs a voltage divider coupled in parallel with the second SCR which develops gating signals proportional to the voltage across the second SCR.

5 Claims, 5 Drawing Figures

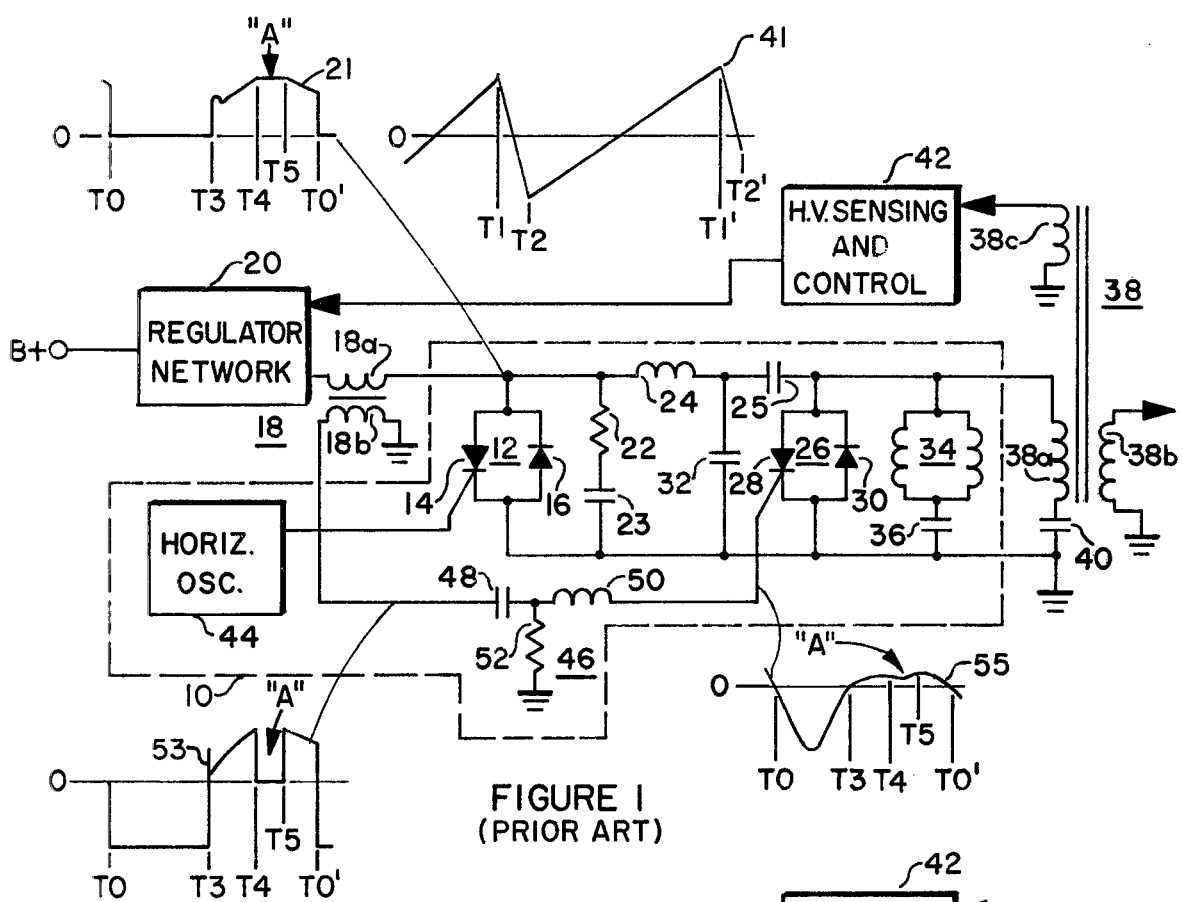
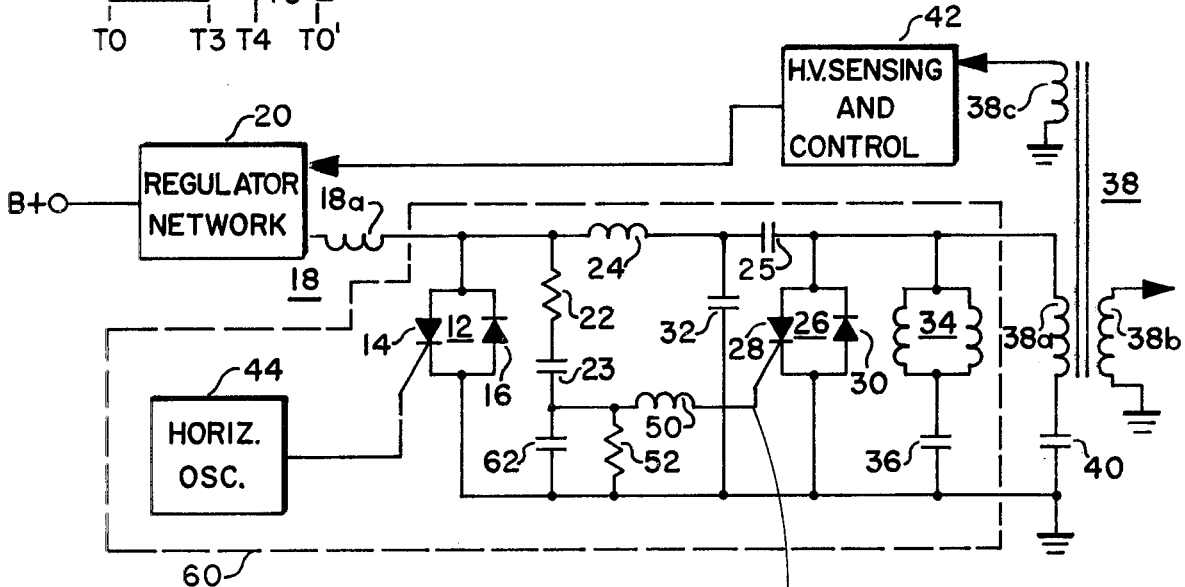
FIGURE 1
(PRIOR ART)
FIGURE 2

3,950,673

GATING CIRCUIT FOR TELEVISION SCR DEFLECTION SYSTEM

BACKGROUND OF THE INVENTION

This invention relates to a gating circuit for controlling a switching device employed in a deflection circuit of a television receiver.

Various deflection system designs have been utilized in television receivers. One design employing two bidirectional conducting switches and utilizing SCR's (thyristors) as part of the switches is disclosed in U.S. Pat. No. 3,452,244. In this type deflection system, a first SCR is employed for coupling a deflection winding across a source of energy during a trace interval of each deflection cycle, and a second SCR is employed for replenishing energy during a commutation interval of each deflection cycle. The first SCR is commonly provided with gating voltage by means of a separate winding or tap of an input reactor coupling a source of B+ to the second SCR.

Various regulator system designs have been utilized in conjunction with the afore described deflection system to provide for uniform high voltage production as well as uniform picture width with varying line voltage and kinescope beam current conditions.

One type regulator system design alters the amount of energy stored in a commutating capacitor coupled between the first and second SCR's during the commutating interval. A regulator design of this type may employ a regulating SCR and diode for coupling the input reactor to the source of B+. With this type regulator a notch, the width of which depends upon the regulation requirements, is created in the current supplied through the reactor and which notch shows up in the voltage waveform developed on the separate winding or tap of the input reactor which provides the gating voltage for the first SCR. The presence of the notch, even though de-emphasized by a waveshaping circuit coupling the gating voltage to the first SCR, causes erratic control of the first SCR.

SUMMARY OF THE INVENTION

In accordance with one embodiment of the invention, a gating circuit of a television deflection system employing a first switching means for coupling a deflection winding across a source of energy during a trace interval of each deflection cycle and a second switching means for replenishing energy to said source of energy during a commutation interval of each deflection cycle includes a voltage divider means coupled in parallel with the second switching means for developing gating signals proportional to the voltage across the second switching means. The voltage divider means are coupled to the first switching means to provide for conduction of the first switching means in response to the gating signals.

A more detailed description of a preferred embodiment of the invention is given in the following description and accompanying drawing of which:

FIG. 1 is a schematic diagram, partially in block form, of a prior art SCR deflection system;

FIG. 2 is a schematic diagram, partially in block form, of an SCR deflection system of the type shown in FIG. 1 including a gating circuit embodying the invention;

DESCRIPTION OF THE PREFERRED EMBODIMENT

Figure 3:
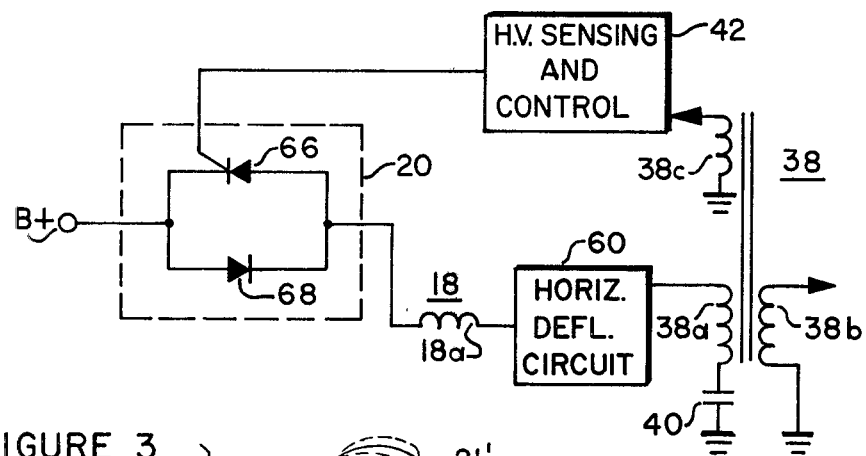
FIG. 3 is a schematic diagram, partially in block form, of one type of a regulator system which employs an SCR as a control device and which is suitable for use with the SCR deflection system of FIG. 2.

FIG. 1 is a schematic diagram, partially in block form, of a prior art deflection system of the retrace driven type similar to that disclosed in U.S. Pat. No. 3,452,244. This system includes a commutating switch 12, comprising a silicon controlled rectifier (SCR) 14 and an oppositely poled damper diode 16. The commutating switch 12 is coupled between a winding 18a of an input choke 18 and ground. The other terminal of winding 18a is coupled to a source of direct current voltage (B+) by means of a regulator network 20 which controls the energy stored in the deflection circuit 10 when the commutating switch is off, during an interval T3 to T0' as shown in curve 21 which is a plot of the voltage level at the anode of SCR 14 during the deflection cycle. A damping network comprising a series combination of a resistor 22 and a capacitor 23 is coupled in parallel with commutating switch 12 and serves to reduce any ringing effects produced by the switching of commutating switch 12. Commutating switch 12 is coupled through a commutating coil 24, a commutating capacitor 25 and a trace switch 26 to ground. Trace switch 26 comprises an SCR 28 and an oppositely poled damper diode 30. An auxiliary capacitor 32 is coupled between the junction of coil 24 and capacitor 25 and ground. A series combination of a horizontal deflection winding 34 and an S-shaping capacitor 36 are coupled in parallel with trace switch 26. Also, a series combination of a primary winding 38a of a horizontal output transformer 38 and a DC blocking capacitor 40 are coupled in parallel with trace switch 26.

A secondary of high voltage winding 38b of transformer 38 produces relatively large amplitude flyback pulses during the retrace interval of each deflection cycle. This interval exists between T1 and T2 of curve 41 which is a plot of the current through windings 34 and 38a during the deflection cycle. These flyback pulses are applied to a high voltage multiplier (not shown) or other suitable means for producing direct current high voltage for use as the ultor voltage of a kinescope (not shown).

An auxiliary winding 38c of transformer 38 is coupled to a high voltage sensing and control circuit 42 which transforms the level of flyback pulses into a pulse width modulated signal. The control circuit 42 is coupled to the regulator network 20.

A horizontal oscillator 44 is coupled to the gate electrode of commutating SCR 14 and produces a pulse during each deflection cycle slightly before the end of the trace interval at T0 of curve 21 to turn on SCR 14 to initiate the commutating interval. The commutating interval occurs between T0 and T3 of curve 21. A resonant waveshaping network 46 comprising a series combination of a capacitor 48 and an inductor 50 coupled between a winding 18b of input choke 18 and the gate electrode of trace SCR 28 and a damping resistor 52 coupled between the junction of capacitor 48 and inductor 50 and ground shapes the signal developed at winding 18b (i.e. voltage waveform 53) to form a gating signal voltage waveform 55 to enable SCR 28 for conduction during the second half of the trace interval occurring between T2 and T1' of curve 41.

The regulator network 20, when of a type to be described in conjunction with FIG. 3, operates in such a manner that current through winding 18a of input choke 18 during an interval between T4 and T5 (region A) of curves 21, 53 and 55 is interrupted for a period of time the duration of which is determined by the signal produced by the high voltage sensing and control circuit 42. During the interruption of current through winding 18a a zero voltage level is developed by winding 18b as shown in interval T4 to T5 of curve 53. The resonant waveshaping circuit 46 produces the shaped waveform 55 which undesirably retains a slump in region A corresponding to the notch A of waveform 53. The slump in waveform 55 applied to SCR 28 occurs in a region where the anode of SCR 28 becomes positive and where SCR 28 must be switched on to maintain a uniform production of the current waveshape in the horizontal deflection winding 34 as shown in curve 41. The less positive amplitude current occurring at region A of waveform 55 may result in insufficient gating current for SCR 28 and may cause erratic performance resulting in an unsatisfactory raster.

FIG. 2 is a schematic diagram, partially in block form, of a deflection system 60 embodying the invention. Those elements which perform the same function in FIG. 2 as in FIG. 1 are labeled with the same reference numerals. FIG. 2 differs from FIG. 1 essentially in that the signal to enable SCR 28 derived from sampling a portion of the voltage across commutating switch 12 rather than a voltage developed by winding 18b which is a function of the voltage across winding 18a of input choke 18 as in FIG. 1. This change eliminates the slump in the enabling signal during the interval T4 to T5 as shown in curve 64 since the voltage across the commutating switch 12 is not adversely effected by the regulator network 20 operation.

A series combination of resistor 22, capacitor 23 and a capacitor 62 is coupled in parallel with commutating switch 12, one terminal of capacitor 62 being coupled to ground. The junction of capacitors 23 and 62 is coupled to the gate electrode of SCR 28 by means of the inductor 50. The resistor 52 is coupled in parallel with capacitor 62.

Capacitors 23 and 62 form a capacitance voltage divider which provides a suitable portion of the voltage across commutating switch 12 for gating SCR 28 via inductor 50. The magnitude of the voltage at the junction of capacitors 23 and 62 is typically 25 to 35 volts. It can, therefore, be seen that the ratio of values of capacitors 23 and 62 will vary depending on the B+ voltage utilized to energize the deflection system. Capacitors 23 and 62 and inductor 50 form a resonant circuit tuned in a manner which provides for peaking of the curve 64 between T4 and T5. This peaking effect further enhances gating of SCR 28 between T4 and T5.

Since the waveshape of the voltage across commutating switch 12 (curve 21) is relatively independent of the type of regulator system employed in conjunction with the deflection system, the curve 64 also is independent of the type of regulator system.

When commutating switch 12 switches off during the interval T3 to T0' curve 21, the voltage across capacitor 62 increases and the voltage at the gate electrode of SCR 28 increases as shown in curve 64. As will be noted, no slump of curve 64 occurs between T3 and T5 because there is no interruption of the voltage across commutating switch 12.

FIG. 3 is a schematic diagram, partially in block form, of one type of a regulator system which may be used in conjunction with the invention. B+ is supplied through a regulator network 20 which comprises an SCR 66 and an oppositely poled diode 68. The diode is poled to provide for conduction of current from B+ to the horizontal deflection circuit 60 via winding 18a of input choke 18. Current flows through the diode during the period T3 to T4 of curve 21 FIG. 1 after which current tries to flow through the SCR 66 from the horizontal deflection circuit to B+ since the commutating capacitor 25 is charged to a voltage higher than B+.

The horizontal deflection circuit 60 produces a flyback pulse in winding 38a of the flyback transformer 38 which is coupled to winding 38c. The magnitude of the pulse on winding 38c determines how long the signal required to switch SCR 66 on is delayed after T4 curve 21 FIG. 1. If the flyback pulse is greater than desirable, the SCR 66 turns on sooner than if the flyback pulse is less than desirable and provides a discharge path for current in commutating capacitor 25 back to the B+ supply. In this manner a relatively constant amplitude flyback pulse is maintained.

Figure 4:
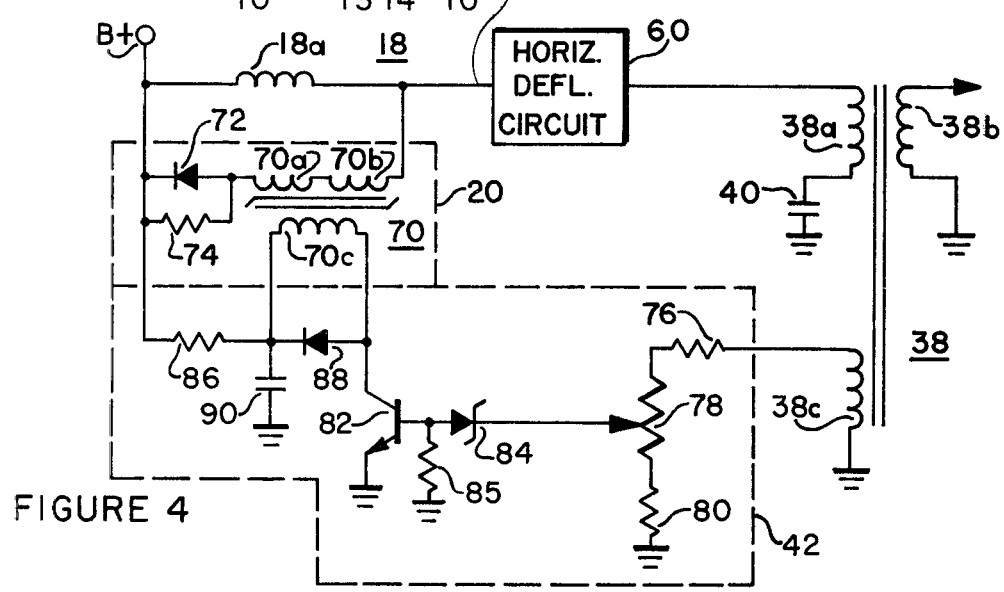
FIG. 4 is a schematic diagram, partially in block form, of another type of a regulator system suitable for use with the deflection circuit of FIG. 2.

FIG. 4 is a schematic diagram, partially in block form, of another well-known type of a regulator system which may be used in conjunction with the invention shown in FIG. 2. B+ is coupled through winding 18a of input choke 18 and through a series combination of windings 70a and 70b of a saturable reactor 70 and a parallel combination of a diode 72 and a resistor 74 to the horizontal deflection circuit 60. Diode 72 is poled to conduct current from the horizontal deflection circuit 60 to B+.

Flyback pulse variations are obtained from winding 38c of the horizontal output transformer 38 and applied to a voltage divider comprising resistors 76, 78 and 80 of the high voltage sensing and control circuit 42. A portion of the pulse produced by winding 38c is selected by the position of the wiper terminal on potentiometer 78 and coupled to the base electrode of a transistor 82 by means of a zener diode 84. The emitter electrode of transistor 82 is grounded and a DC stabilization resistor 85 is coupled in parallel with the base-emitter junction of transistor 82. When the pulse magnitude on winding 38c exceeds a level which results in forward biasing the base-emitter junction of transistor 82, current flows from B+ through a resistor 86, a winding 70c of saturable reactor 70 and transistor 82 to ground. Due to the exponential increase of current in winding 70c during the period of conduction of transistor 82, the duration of conduction of transistor 82 determines the magnitude of current flowing in winding 70c and thus the total inductance of windings 70a and 70b. The current in winding 70c is sustained during the remaining deflection period by means of a diode 88 coupled in parallel with winding 70c and poled not to conduct current from B+ to the collector electrode of transistor 82. A capacitor 90 coupled to the cathode of diode 88 provides a bypass for B+. Windings 70a and 70b are in parallel with input reactor 18a and thereby affect the total input inductance of the deflection circuit and thereby controls the transfer of energy to the deflection circuit. The dotted waveforms shown in conjunction with a curve 21' indicate variations from a nominal waveform provided at the input of horizontal deflection circuit 60 by the windings 70a and 70b.

Figure 5:
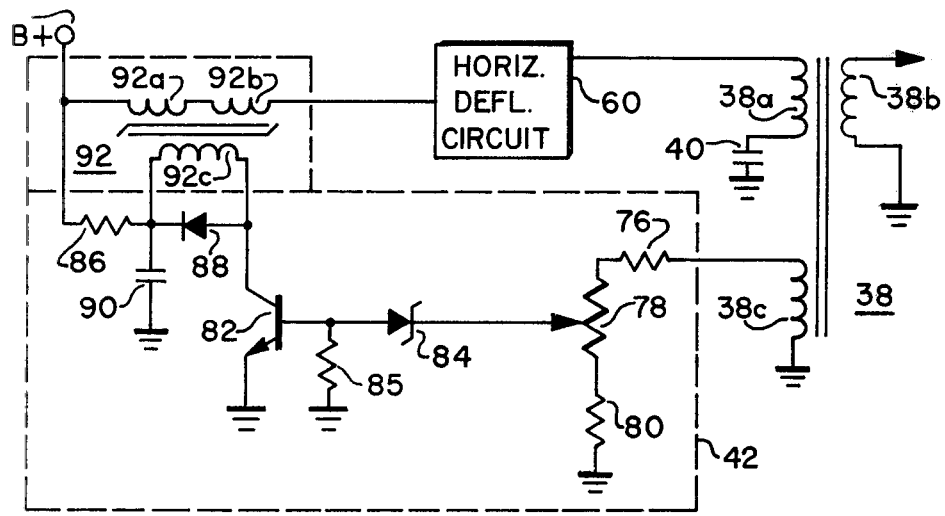
FIG. 5 is a schematic diagram, partially in block form, of still another type of a regulator system suitable for use with the SCR deflection system of FIG. 2.

FIG. 5 is a schematic diagram of yet another type of a regulator system which may be used in conjunction with the invention. B+ is coupled through a winding 92a and a winding 92b of a saturable reactor to the horizontal deflection circuit 60. Windings 92a and 92b are used to replace the input choke 18 shown in FIGS. 1 and 2 while also providing for a regulating function corresponding to that provided by regulating network 20.

Flyback pulse variations are obtained from winding 38c and applied to the high voltage sensing and control circuit 42 as in FIG. 4. Current flows from B+ through resistor 86, a winding 92c and transistor 82 to ground. As in FIG. 4 the duration of the conduction of transistor 82 determines the energy stored in winding 92c and thus the total inductance of windings 92a and 92b which control the amount of energy transferred to the deflection circuit during each horizontal deflection cycle. The variations in waveforms of curve 21', shown in conjunction with FIG. 4, are also provided at the input of horizontal deflection circuit 60 by windings 92a and 92b.

For various reasons including cost or performance, a manufacturer may wish to utilize a particular one of the regulators illustrated in FIGS. 3, 4 and 5. Regardless of the choice, the gating circuit according to the invention may be utilized therewith advantageously by providing improved performance and the possibility of cost savings by eliminating taps or extra windings on the wound components which heretofore normally provided a source of SCR gating waveforms.

What is claimed is:

1. In a television deflection system in which a first switching means couples a deflection winding across a source of energy during a trace interval of each deflection cycle and a second switching means replenishes energy to said source of energy during a commutation interval of each deflection cycle, a gating circuit for said first switching means, comprising:
   capacitive voltage divider means coupled in parallel with said second switching means for developing gating signals proportional to the voltage across said second switching means; and
   means for coupling said voltage divider means to said first switching means to provide for conduction of said first switching means in response to said gating signals.

2. A gating circuit according to claim 1 wherein said voltage divider includes first and second capacitors coupled in series and providing said gating signals at the common terminal of said capacitors.

3. A gating circuit according to claim 2 wherein said first and second capacitors are proportional in value to provide for the desired magnitude of gating signals.

4. A gating circuit according to claim 3 wherein said means for coupling said voltage divider means to said first switching means includes an inductor.

5. A gating circuit according to claim 4 wherein said inductor and said first and second capacitors comprise a resonant circuit having a resonant frequency chosen to shape said gating signal to improve switching of said first switching means.

* * * * *